US008413714B2

(12) United States Patent
Nie et al.

(10) Patent No.: US 8,413,714 B2
(45) Date of Patent: Apr. 9, 2013

(54) HEAT DISSIPATION DEVICE HAVING A FAN HOLDER THEREON

(75) Inventors: Wei-Cheng Nie, Shenzhen (CN); Hong-Cheng Yang, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 972 days.

(21) Appl. No.: 12/482,460

(22) Filed: Jun. 11, 2009

(65) Prior Publication Data

US 2010/0258281 A1 Oct. 14, 2010

(30) Foreign Application Priority Data

Apr. 14, 2009 (CN) .......................... 2009 1 0301553

(51) Int. Cl.
F24H 3/02 (2006.01)
(52) U.S. Cl.
USPC .................................. 165/121; 24/26; 24/270
(58) Field of Classification Search .................. 165/80.3, 165/121, 185; 24/26–29, 270, 273; 220/203.1, 220/203.09, 213, 780, 793, 802
See application file for complete search history.

(56) References Cited

U.S. PATENT DOCUMENTS

| 461,407 | A | * | 10/1891 | Ellis | 24/27 |
| 464,338 | A | * | 12/1891 | Crisp | 24/27 |
| 636,436 | A | * | 11/1899 | Lankford | 24/30.5 R |
| 996,478 | A | * | 6/1911 | Francis | 24/270 |
| 1,912,114 | A | * | 5/1933 | Allen | 24/270 |
| 2,768,418 | A | * | 10/1956 | Hoy et al. | 24/270 |
| 4,296,534 | A | * | 10/1981 | Nagano | 24/270 |
| 5,865,476 | A | * | 2/1999 | Kramer | 285/242 |
| 6,022,055 | A | * | 2/2000 | Coulonvaux et al. | 292/113 |
| 7,931,310 | B2 | * | 4/2011 | Lake | 285/365 |
| 2003/0019609 | A1 | * | 1/2003 | Hegde | 165/80.3 |

* cited by examiner

*Primary Examiner* — Marc Norman
*Assistant Examiner* — Devon Russell
(74) *Attorney, Agent, or Firm* — Altis Law Group, Inc.

(57) ABSTRACT

A heat dissipation device includes a heat sink forming an engaging portion along an outer periphery thereof, a fan holder attached to the heat sink and a fan secured to the heat sink via the fan holder. The fan holder includes an elastic main body, a first clip pivotally connected to a free end of the elastic main body and a second clip connected with the first clip and engaging with an opposite free end of the elastic main body. The elastic main body includes a pair of fixing portions formed at upper and lower sides thereof. The lower fixing portion of the fan holder is tightly engaged with the engaging portion of the heat sink and the upper fixing portion presses the fan towards the heat sink when the second clip is tightly locked to the opposite free end of the elastic main body.

13 Claims, 4 Drawing Sheets

HEAT DISSIPATION DEVICE HAVING A FAN HOLDER THEREON

BACKGROUND

1. Technical Field

The disclosure relates generally to a heat dissipation device, and more particularly to a heat dissipation device having a fan holder for mounting a fan onto a heat sink of the heat dissipation device, wherein the fan can be easily assembled to and disassembled from the fan holder.

2. Description of Related Art

It is well known that during operation computer electronic devices such as central processing units (CPUs) can generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

Generally, in order to improve heat dissipation efficiency of a heat sink, a fan is desired to direct airflow onto the heat sink. It is generally to fix the fan onto the heat sink with screws. Furthermore, it is necessary to disassemble the fan from the heat sink when dust particles accumulate in the fan and the heat sink, whereby the fan and the heat sink can be cleaned. Otherwise, heat dissipation efficiency of the heat sink will be decreased and a lifespan of the fan will be shortened. After cleaning of the fan and heat sink, it is required to assemble the fan to the heat sink again. Both the disassembling and assembling require to rotate the screws by using a screwdriver. Such an unscrewing and screwing operation is laborious and time consuming. In addition, it is possible that the screws or screwdriver may drop to cause damages to computer components in the process of assembling and disassembling.

What is needed, therefore, is a heat dissipation device which has a fan holder for mounting a fan onto a heat sink wherein the fan can be easily assembled to and disassembled from the fan holder without a tool.

BRIEF DESCRIPTION OF THE DRAWINGS

Other advantages and novel features of the disclosure will become more apparent from the following detailed description of an embodiment/embodiments when taken in conjunction with the accompanying drawings.

DETAILED DESCRIPTION

Figure 1:
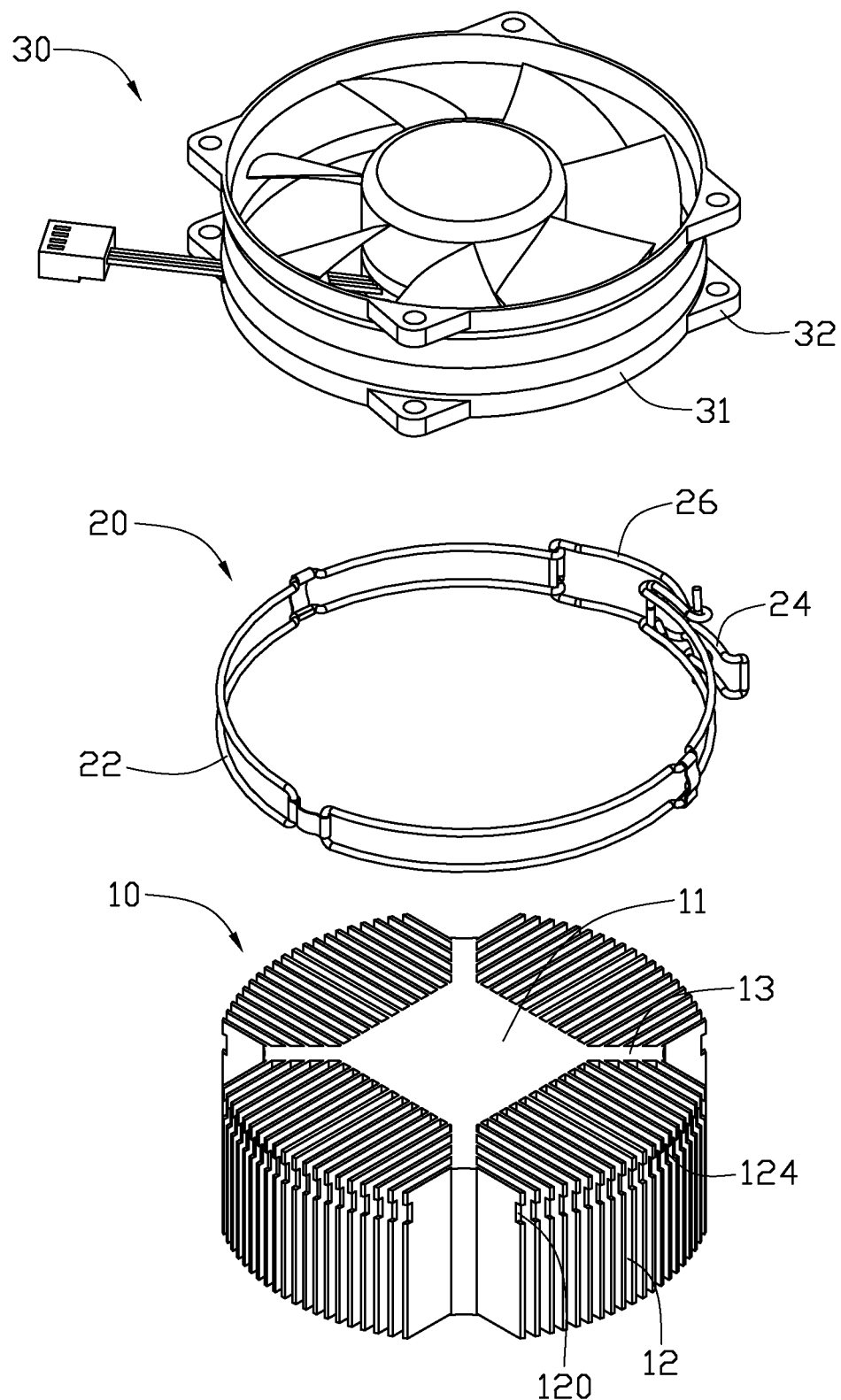
FIG. 1 is an exploded, isometric view of a heat dissipation device in accordance with an exemplary embodiment of the disclosure.
Figure 2:
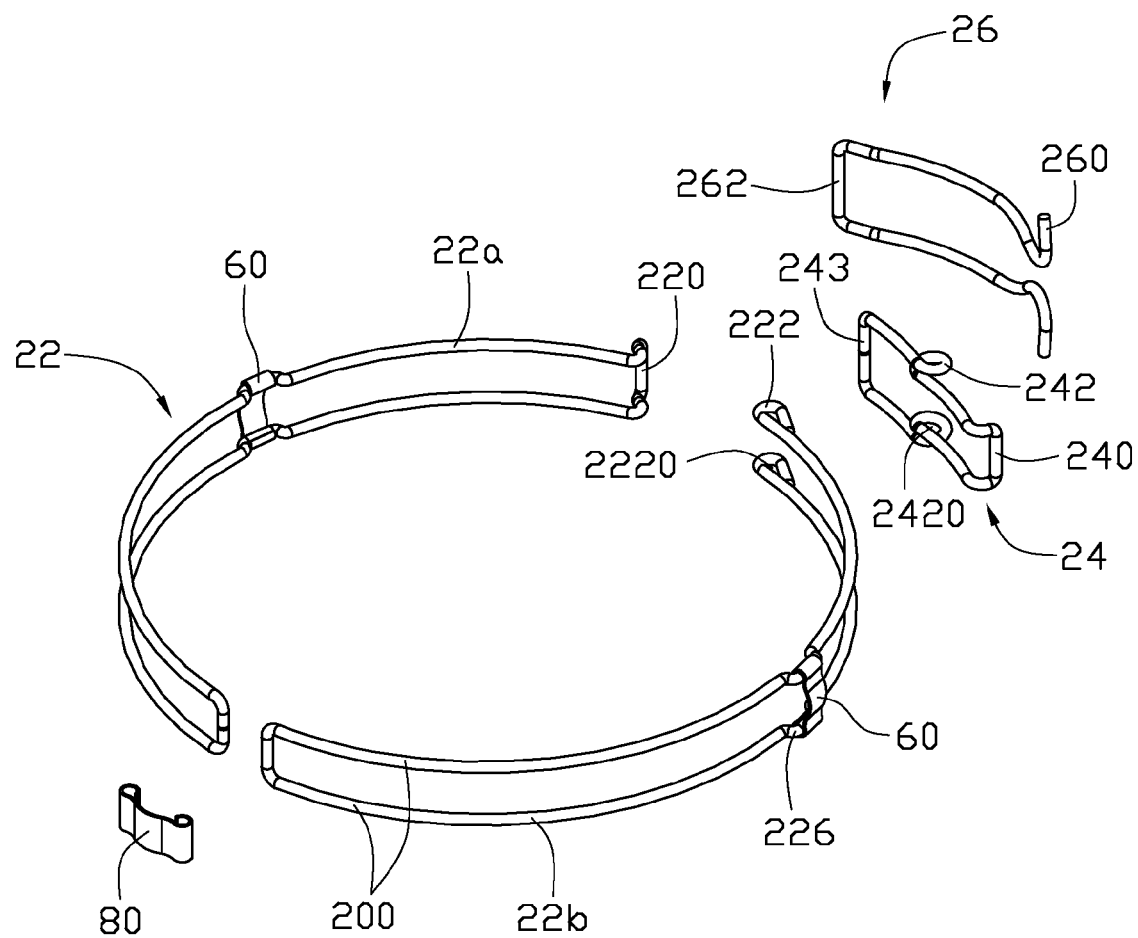
FIG. 2 is an enlarged, exploded view of a fan holder of the heat dissipation device of FIG. 1.

Referring to FIGS. 1-4, a heat dissipation device in accordance with an exemplary embodiment of the disclosure is shown. The heat dissipation device comprises a heat sink 10, a fan holder 20 attached to the heat sink 10 and a fan mounted to the heat sink 10 via the fan holder 20.

The heat sink 10 comprises a core 11 having a configuration of a rectangular parallelepiped and four symmetrical branches 13 extending outwardly from four corners of the core 11. A plurality of fins 12 projects outwardly from outer side surfaces of the core 11 and the branches 13. The fins 12 each have a circumferential outer surface, which is so configured that the heat sink 10 has a cylindrical configuration. The fins 12 can be divided into four groups oriented at four different directions. Four side surfaces of the core 11 and the four branches 13 form four regions. Each group of the fins 12 is formed at a corresponding region. Two neighboring groups of the fins 12 are oriented perpendicularly to each other. Each fin 12 of each group defines a recessed slot 120 in an outer edge thereof, adjacent to a top of the each fin 12. All the recessed slots 120 cooperatively define an engaging portion, for example, a receiving groove 124 in a circumference of the each group of the fins 12 and near a top of the heat sink 10, for engagingly receiving the fan holder 20.

Figure 3:
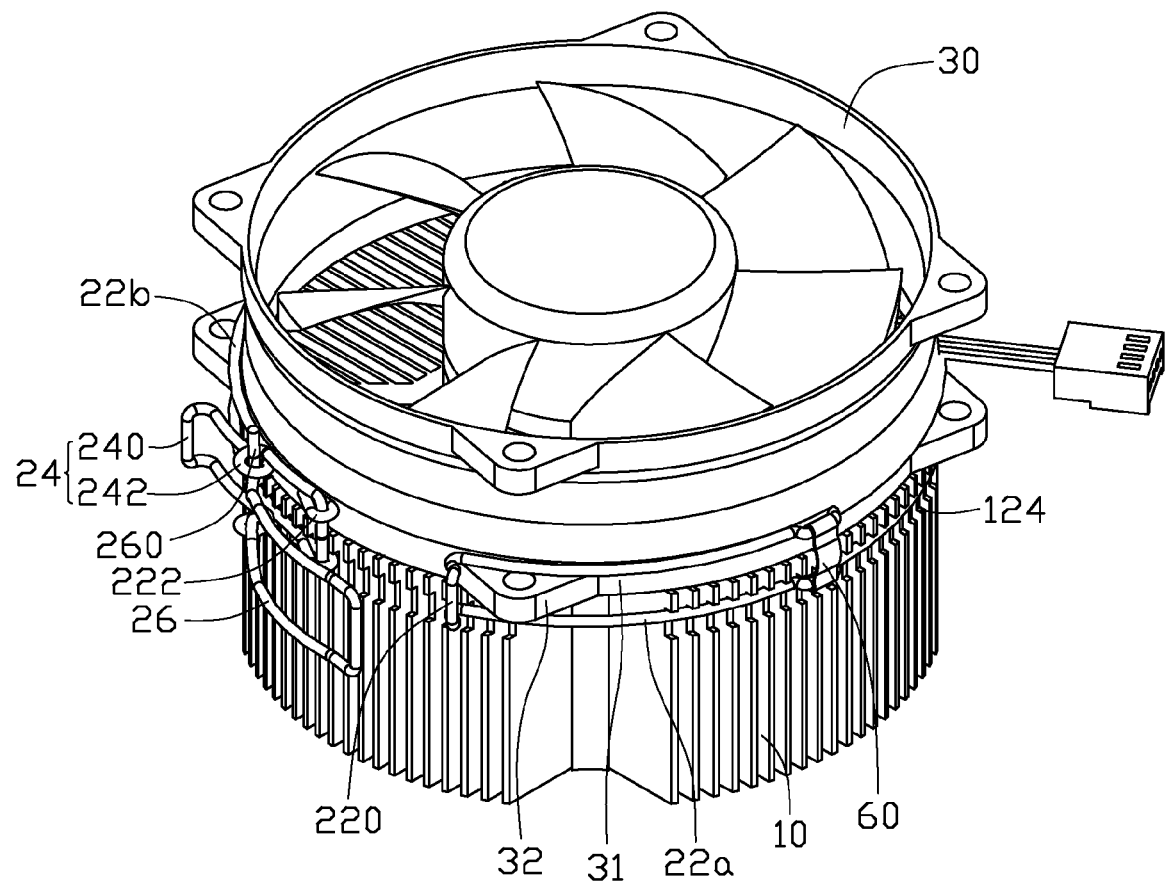
FIG. 3 is a partially assembled view of FIG. 1.

As shown in FIGS. 1 and 3, the fan holder 20 is attached to the top portion of the heat sink 10. The fan holder 20 is made of a metal wire and has a ring configuration with a size corresponding to that of the top portion of the heat sink 10. The fan holder 20 comprises a pair of fixing portions 200 at upper and lower sides thereof, for engaging with the fan 30 and the heat sink 10, respectively. The fan holder 20 comprises an elastic main body 22 having a first connecting portion 22a and a second connecting portion 22b connecting with the first connecting portion 22a via a first spring 80 along a circumferential direction of the elastic main body 22. A first clip 24 is pivotally connected to a free end of the second connecting portion 22b and a second clip 26 is pivotally engaged with the first clip 24.

Each of the first and second connecting portions 22a, 22b comprises a pair of fixing ears 226 extending horizontally and outwardly from a middle portion thereof. Two second springs 60 respectively clasp the fixing ears 226 of the first and second connecting portions 22a, 22b to enhance an integrity of the first and second connecting portions 22a, 22b along a bottom-to-top direction of the fan holder 20, thereby facilitating the fixing portions 200 of the fan holder 20 to engage with the fan 30 and the heat sink 10, and enhancing the capability of the fan holder 20 in holding the fan 30 to the heat sink 10.

The first connecting portion 22a has an arched shape and is formed by bending a metal wire. A clasping portion 220 is bent outwardly from a free end of the first connecting portion 22a, for engaging with the second clip 26. The second connecting portion 22b forms a pair of parallel first pivots 222 by bending outwardly a free end thereof. The first pivots 222 are for engaging with the first clip 24. Each first pivot 222 defines a first pivot hole 2220 therein to receive an axle 243 formed at a front end of the first clip 24 to pivotally connect the first clip 24 to the second connecting portion 22b. The axle 243 is located opposite to an operating portion 240 of the first clip 24.

The first clip 24 is formed by bending a metal wire and has the operating portion 240 opposite the front end thereof and a pair of second pivots 242 in a middle of the axle 243 and the operating portion 240. Each second pivot 242 defines a second pivot hole 2420 therein to receive a free end of the second clip 26 to connect the second clip 26 to the first clip 24. The second clip 26 is formed by bending a metal wire and has a U-shaped configuration. The second clip 26 forms a pair of hooking portions 260 by outwardly bending two free ends thereof. The hooking portions 260 extend through the second pivot holes 2420 of the first clip 24 to connect the second clip 26 to the first clip 24. A front end of the second clip 26 opposite to the hooking portions 260 forms an engaging rod 262 which is used to engage with the clasping portion 220 of the first connecting portion 22a, whereby the fan holder 20 forms a ring configuration.

The fan 30 has a pair of frames 31 with a shape and size corresponding to that of the top of the heat sink 10 and the fan holder 20. A lower frame 31 comprises a plurality of spaced mounting ears 32 extending horizontally and outwardly from an outer edge thereof, for engaging with the upper fixing portion 200 of the fan holder 20.

In assembly, the fan 30 is placed on the top portion of the heat sink 10 and the fan holder 20 encloses the top portion of the heat sink 10 and the lower frame 31 of the fan 30. The lower fixing portion 200 of the fan holder 20 is received in the receiving groove 124 of the heat sink 10 and the upper fixing portion 200 of the fan holder 20 is placed on upper surfaces of the mounting ears 32 of the lower frame 31 of the fan 30. The second clip 26 is separated from the clasping portion 220 of the first connecting portion 22a, as shown in FIG. 3. Thus, the fan holder 20 can be easily attached to the fan 30 and the heat sink 10 in a loose state.

Figure 4:
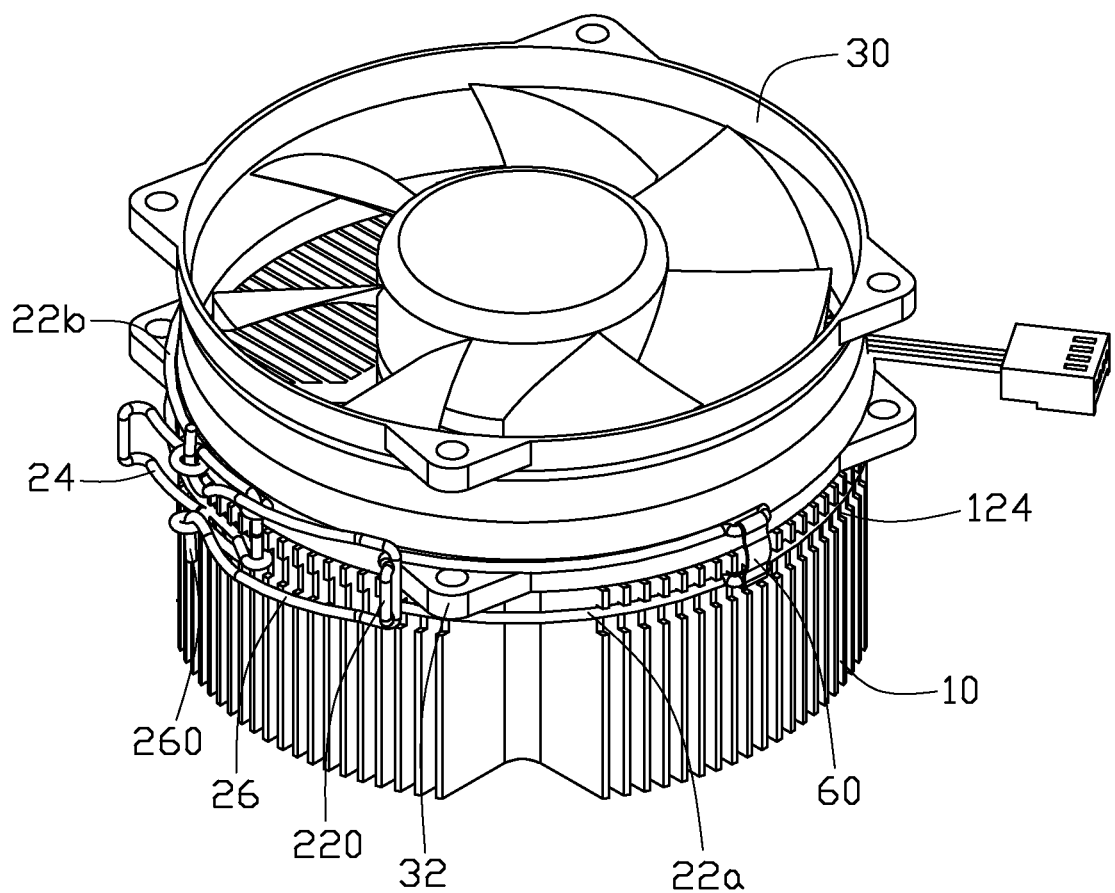
FIG. 4 is an assembled view of FIG. 1.

The operating portion 240 of the first clip 24 is rotated in respect to the axle 243 along a direction toward the clasping portion 220 to cause the engaging rod 262 of the second clip 26 to move toward the clasping portion 220. The engaging rod 262 of the second clip 26 is moved to be attached to the clasping portion 220 of the first connecting portion 22a of the fan holder 20. Thereafter, the operating portion 240 of the first clip 24 is rotated in respect to the axle 243 reversely along a direction away from the clasping portion 220 until the engaging rod 262 of the second clip 26 tightly engages with the clasping portion 220 of the first connecting portion 22a of the fan holder 20, as shown in FIG. 4. At this position, a gap between the clasping portion 220 and the first pivots 222 is narrowed. Furthermore, at this position, the first and second connecting portions 22a, 22b are tightly connected together via the second clip 26, whereby the lower fixing portion 200 of the fan holder 20 is securely retained in the receiving groove 124 of the heat sink 10 and the upper fixing portion 200 of the fan holder 20 tightly abuts against the upper surfaces of the mounting ears 32 of the lower frame 31 of the fan 30. Thus, the fan 30 is tightly mounted on the top portion of the heat sink 10 via the fan holder 20. For removal of the fan 30 from the top portion of the heat sink 10, the operating portion 240 of the first clip 24 is rotated toward the clasping portion 220 again to release the tight engagement between the engaging rod 262 and the clasping portion 220, whereby the second clip 26 can be disengaged from the clasping the portion 220 of the first connecting portion 22a of the fan holder 20. Here, the spring force of the fan holder 20 acting on the lower frame 31 of the fan 20 and the top portion of the heat sink 10 is released, and the fixing portions 200 of the fan holder 20 can be removed from the fan 30 and the heat sink 10. Thus, the disassembly of the fan 20 from the heat sink 10 can be expediently carried out. The fan 30 can be easily assembled to and disassembled from heat sink 10 by the fan holder 20 without using a tool.

By provision of the upper and lower fixing portions 200 of the fan holder 20, the lower frame 31 of the fan 30 is tightly depressed by the upper fixing portion 200 of the fan holder 20 toward the top portion of the heat sink 10, whereby the fan 30 is firmly secured to the top portion of the heat sink 10 along a top-to-bottom direction of the heat sink 10.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a heat sink comprising an engaging portion in an outer periphery thereof;
    a fan mounted on a top of the heat sink; and
    a ring-shaped fan holder securing the fan to the heat sink, having a ring-shaped main body with first and second free ends spaced from and facing each other, a first clip having an axle pivotally connected to the first free end, an operating portion opposite the axle adapted for receiving a force to rotate the first clip in respect to the axle and at least one pivot between the axle and the operating portion, a second clip having an end connecting with the at least one pivot and an engaging rod opposite the end for engaging with the second free end of the fan holder;
    wherein the main body of the fan holder is formed by bending a metal wire, and defines a first fixing portion engaging with the fan and a second fixing portion engaging with the engaging portion of the heat sink; and
    wherein when the engaging rod engages with the second free end and the first clip is rotated in respect to the axle to reach a position wherein the operating portion is remote from the second free end, the engaging rod has a tight engagement with the second free end, whereby the heat sink and the fan are securely connected together by the fan holder.

2. The heat dissipation device of claim 1, wherein the main body of the fan holder comprises first and second connecting portions interconnecting each other via a first spring along a circumferential direction of the main body of the fan holder.

3. The heat dissipation device of claim 2, wherein the first and second fixing portions of the main body of the fan holder are connected with each other via a pair of second springs along a height direction of the main body of the fan holder.

4. The heat dissipation device of claim 3, wherein the first clip forms a pair of pivots between the axle and the operating portion thereof, and the end of the second clip connecting with the at least one pivot forms a pair of hooking portions extending into the pair of pivots respectively.

5. The heat dissipation device of claim 4, wherein the second free end of the main body of the fan holder comprises a clasping portion for engaging with the engaging rod of the second clip.

6. The heat dissipation device of claim 1, wherein the heat sink comprises a core and a plurality of fins extending outwardly from the core and the engaging portion of the heat sink is defined in outer edges of the fins of the heat sink.

7. The heat dissipation device of claim 6, wherein the engaging portion of the heat sink is a receiving groove recessed in an outer periphery of the fins of the heat sink, and the second fixing portion of the main body of the fan holder is retained in the receiving groove.

8. A fan holder adapted for mounting a fan to a heat sink, the fan holder comprising:
    an elastic main body formed by bending a metal wire and defining a pair of fixing portions at top and bottom sides thereof and a pair of springs connecting the pair of fixing portions along a top-bottom direction of the elastic main body, the elastic main body having first and opposite second free ends spaced from and facing each other;
    a first clip having an axle pivotally connected to the first free end of the elastic main body; and
    a second clip pivotally engaged with the first clip;
    wherein the second clip is moveable to engage with the second free end of the elastic main body when the first clip is rotated relative to the first free end of the elastic main body to a first position; and wherein the fan holder can produce a spring force and a gap between the first free end and the second free end of the elastic main body, the fan holder can be narrowed when the second clip is engaged with the second free end of the elastic main body and the first clip is rotated relative to the first free end of the elastic main body from the first position to a second position, in which the first clip is moved away from the second free end.

9. The fan holder of claim 8, wherein the elastic main body comprises a first connecting portion and a second connecting portion connected to the first connecting portion via another spring along a circumferential direction of the elastic main body.

10. The fan holder of claim 9, wherein the first clip further comprises an operating portion opposite the axle adapted for receiving a force to rotate the first clip in respect to the axle, and at least one pivot between the axle and the operating portion.

11. The fan holder of claim 10, wherein the second clip has an end connecting with the at least one pivot and an engaging rod opposite the end for engaging with the second free end of the fan holder.

12. The fan holder of claim 11, wherein the at least one pivot of the first clip is a pair of pivots, and the end of the second clip connecting with the pair of pivots forms a pair of hooking portions extending into the pair of pivots respectively.

13. The fan holder of claim 12, wherein the second free end of the main body comprises a clasping portion for engaging with the engaging rod of the second clip.

* * * * *